United States Patent
Liao

(10) Patent No.: US 10,872,760 B2
(45) Date of Patent: Dec. 22, 2020

(54) CLUSTER TOOL AND MANUFACUTURING METHOD OF SEMICONDUCTOR STRUCTURE USING THE SAME

(71) Applicant: TAIWAN SEMICONDUCTOR MANUFACTURING CO., LTD., Hsinchu (TW)

(72) Inventor: Han-Wen Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/219,512

(22) Filed: Jul. 26, 2016

(65) Prior Publication Data

US 2018/0033611 A1    Feb. 1, 2018

(51) Int. Cl.
| | |
|---|---|
| H01L 21/02 | (2006.01) |
| H01L 29/66 | (2006.01) |
| H01L 21/67 | (2006.01) |
| H01J 37/317 | (2006.01) |
| H01L 21/306 | (2006.01) |
| H01L 21/3065 | (2006.01) |
| H01J 37/32 | (2006.01) |
| H01L 29/78 | (2006.01) |

(52) U.S. Cl.
CPC ...... *H01L 21/02071* (2013.01); *H01J 37/317* (2013.01); *H01J 37/32899* (2013.01); *H01L 21/02057* (2013.01); *H01L 21/02068* (2013.01); *H01L 21/3065* (2013.01); *H01L 21/30604* (2013.01); *H01L 21/67196* (2013.01); *H01L 21/67201* (2013.01); *H01L 21/67213* (2013.01); *H01L 29/66545* (2013.01); *H01L 29/78* (2013.01); *H01J 2237/317* (2013.01)

(58) Field of Classification Search
CPC ......... H01L 21/02; H01L 37/31; H01L 29/66; H01L 21/02071; H01L 21/02057; H01L 21/02068; H01L 21/30604; H01L 21/3065
USPC ........................................................ 438/595
See application file for complete search history.

(56) References Cited

U.S. PATENT DOCUMENTS

| | | | | |
|---|---|---|---|---|
| 5,824,455 | A * | 10/1998 | Komatsu ............... | C23C 16/047 430/323 |
| 5,863,706 | A * | 1/1999 | Komatsu ............... | C23C 16/047 430/313 |
| 6,033,993 | A * | 3/2000 | Love, Jr. .............. | C11D 3/0073 257/E21.31 |

(Continued)

OTHER PUBLICATIONS

Moseley, Henry G. J, "The High Frequency Spectra of the Elements", Philosophical Magazine (1913).

*Primary Examiner* — Sheikh Maruf
(74) *Attorney, Agent, or Firm* — McClure, Qualey & Rodack, LLP

(57) ABSTRACT

A cluster tool includes a polyhedral transfer chamber, at least one processing chamber, at least one load lock chamber, and an electron beam (e-beam) source. The processing chamber is connected to the polyhedral transfer chamber. The processing chamber is configured to perform a manufacturing procedure to a wafer present therein. The load lock chamber is connected to the polyhedral transfer chamber. The e-beam source is configured to performing an e-beam treatment to the wafer after the wafer is performed the manufacturing procedure.

20 Claims, 8 Drawing Sheets

(56) References Cited

U.S. PATENT DOCUMENTS

| | | | |
|---|---|---|---|
| 6,218,090 B1* | 4/2001 | Minter | G03F 7/2024 257/E21.255 |
| 6,429,142 B1* | 8/2002 | Peng | H01L 21/02071 216/64 |
| 7,078,689 B1* | 7/2006 | Adler | H01J 37/185 250/306 |
| 9,748,169 B1* | 8/2017 | Murray | H01L 23/5329 |
| 2001/0044211 A1* | 11/2001 | Geusic | C23G 5/00 438/694 |
| 2002/0072016 A1* | 6/2002 | Chen | G03F 7/427 430/323 |
| 2002/0094693 A1* | 7/2002 | Yang | H01L 21/0271 438/712 |
| 2003/0232495 A1* | 12/2003 | Moghadam | B05D 1/60 438/623 |
| 2006/0051959 A1* | 3/2006 | Iwatake | H01L 21/28518 438/643 |
| 2006/0134920 A1* | 6/2006 | Liang | H01L 21/02071 438/710 |
| 2006/0175708 A1* | 8/2006 | Ueno | H01L 21/76829 257/774 |
| 2007/0032004 A1* | 2/2007 | Ramaswamy | H01L 21/76843 438/197 |
| 2007/0032054 A1* | 2/2007 | Ramaswamy | C23C 16/26 438/513 |
| 2007/0032095 A1* | 2/2007 | Ramaswamy | B23K 26/0608 438/795 |
| 2007/0059922 A1* | 3/2007 | Clevenger | H01L 21/02063 438/637 |
| 2007/0202254 A1* | 8/2007 | Ganguli | H01L 21/76846 427/252 |
| 2008/0029754 A1* | 2/2008 | Min | H01L 27/2409 257/4 |
| 2008/0138972 A1* | 6/2008 | Kang | G03F 7/422 438/595 |
| 2008/0160256 A1* | 7/2008 | Bristol | B24B 37/042 428/143 |
| 2009/0004850 A1* | 1/2009 | Ganguli | C23C 16/18 438/655 |
| 2009/0029548 A1* | 1/2009 | Jung | H01L 21/02071 438/669 |
| 2009/0053538 A1* | 2/2009 | Ma | H01L 21/76888 428/457 |
| 2010/0022030 A1* | 1/2010 | Ditizio | C07D 401/04 438/3 |
| 2010/0038723 A1* | 2/2010 | Babich | H01L 21/76816 257/384 |
| 2010/0043820 A1* | 2/2010 | Kawamura | H01J 37/32862 134/1.1 |
| 2010/0072522 A1* | 3/2010 | Hashimi | H01L 21/02071 257/288 |
| 2011/0027999 A1* | 2/2011 | Sparks | C23F 4/00 438/712 |
| 2011/0061812 A1* | 3/2011 | Ganguly | H01L 21/0223 156/345.34 |
| 2011/0065276 A1* | 3/2011 | Ganguly | H01L 21/0223 438/694 |
| 2012/0034786 A1* | 2/2012 | Dhindsa | C23C 16/4412 438/710 |
| 2012/0164839 A1* | 6/2012 | Nishimura | C23F 4/00 438/720 |
| 2013/0019905 A1* | 1/2013 | Ji | H01L 21/02057 134/30 |
| 2013/0059444 A1* | 3/2013 | Shao | C23F 4/00 438/706 |
| 2013/0059445 A1* | 3/2013 | Shao | H01L 21/3065 438/707 |
| 2013/0059446 A1* | 3/2013 | Tabat | C23F 4/00 438/708 |
| 2013/0098872 A1* | 4/2013 | Dorf | H01J 37/3233 216/67 |
| 2013/0330845 A1* | 12/2013 | Olsen | H01L 21/3065 438/14 |
| 2013/0337655 A1* | 12/2013 | Lee | H01J 37/32844 438/715 |
| 2014/0008767 A1* | 1/2014 | Li | B82Y 20/00 257/618 |
| 2014/0263272 A1* | 9/2014 | Duan | C23C 16/4404 219/443.1 |
| 2014/0332964 A1* | 11/2014 | Yang | H01L 23/5329 257/762 |
| 2015/0093862 A1* | 4/2015 | Nainani | H01L 21/02063 438/197 |
| 2015/0099369 A1* | 4/2015 | Deshmukh | H01L 21/32135 438/720 |
| 2015/0118858 A1* | 4/2015 | Takaba | H01L 21/31116 438/719 |
| 2015/0129541 A1* | 5/2015 | Wang | H01L 21/02071 216/13 |
| 2015/0144786 A1* | 5/2015 | Gwinn | H01J 37/30 250/307 |
| 2015/0243523 A1* | 8/2015 | Li | H01L 21/82384 438/585 |
| 2015/0270135 A1* | 9/2015 | Tabat | H01L 21/02046 438/712 |
| 2015/0380265 A1* | 12/2015 | Yim | H01L 21/02126 438/781 |
| 2016/0005572 A1* | 1/2016 | Liang | B05B 1/005 156/345.33 |
| 2016/0005833 A1* | 1/2016 | Collins | H01L 29/785 257/288 |
| 2016/0035586 A1* | 2/2016 | Purayath | H01L 21/32137 438/694 |
| 2016/0133519 A1* | 5/2016 | Holden | H01L 21/78 438/462 |
| 2016/0222521 A1* | 8/2016 | Chae | G03F 7/40 |
| 2017/0207214 A1* | 7/2017 | Or-Bach | H01L 21/6835 |
| 2017/0236759 A1* | 8/2017 | Jagannathan | H01L 21/845 257/392 |
| 2019/0371612 A1* | 12/2019 | Xue | H01L 27/11521 |

* cited by examiner

CLUSTER TOOL AND MANUFACUTURING METHOD OF SEMICONDUCTOR STRUCTURE USING THE SAME

BACKGROUND

Recent advances in semiconductor performance have been driven in no small part by increased manufacturing precision and reduced device geometries. As feature size shrinks, the associated circuits become more sensitive to contamination during the manufacturing process. The cluster tool is a development in semiconductor manufacturing. By providing multiple tools within a single chassis, several manufacturing procedures can be performed on a semiconductor wafer without exposing it to the outside environment. The seals within the cluster tool can be used to create different atmospheric zones. For example, the processing chamber and the polyhedral transfer chamber may operate in a vacuum while the load lock and wafer transport carrier operate in an inert gas atmosphere. Furthermore, because the wafer is not directly exposed to the fab environment, a low particle atmosphere can be maintained around the wafer while the rest of the fab operates with less stringent controls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
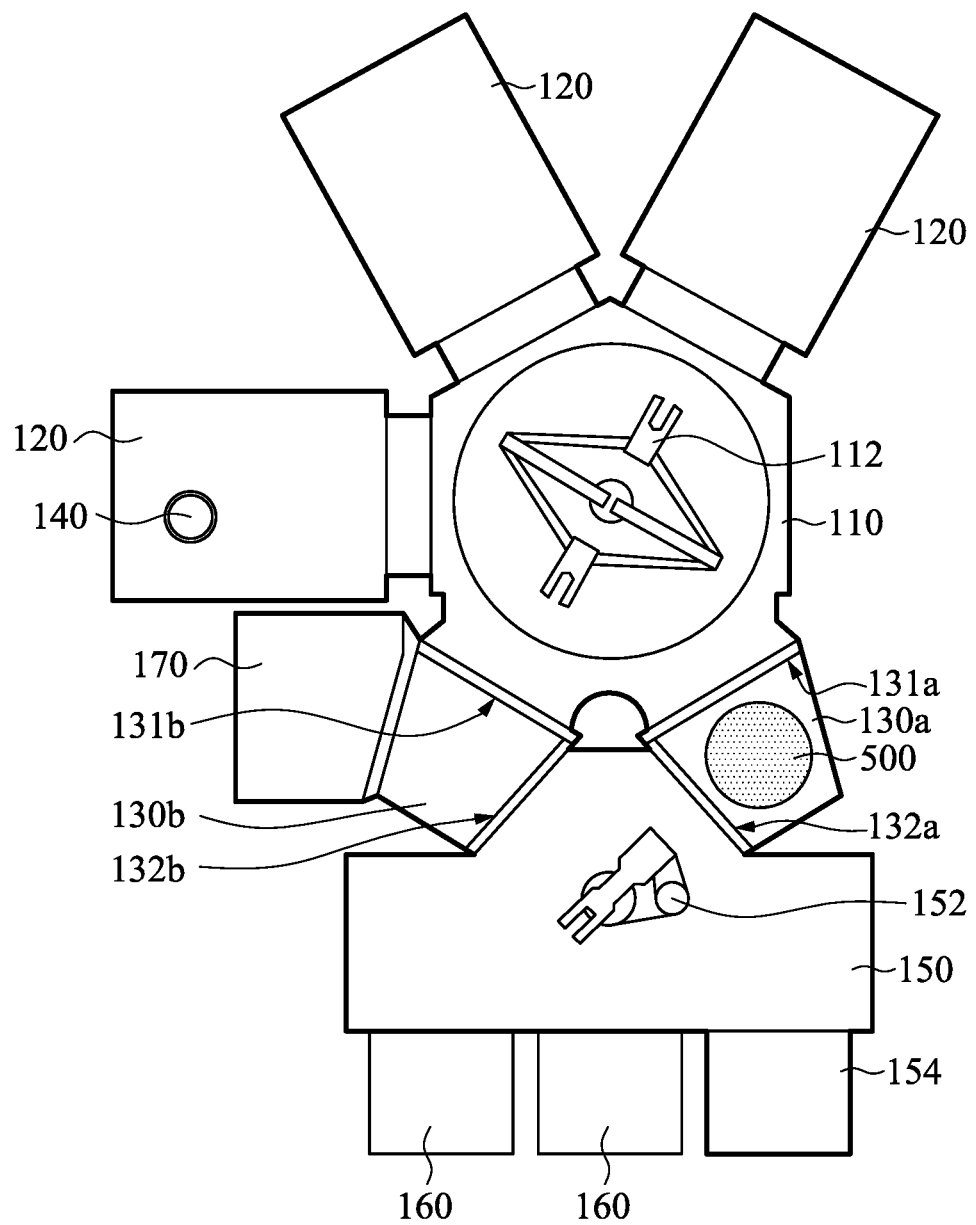
FIG. 1 is a schematic plan view of a cluster tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a schematic plan view of a cluster tool 100 in accordance with some embodiments of the present disclosure. The cluster tool 100 includes a polyhedral transfer chamber 110, at least one processing chamber 120, at least one load lock chamber, and at least one electron beam (e-beam) source 140. For example, in FIG. 1, the cluster tool 100 includes the polyhedral transfer chamber 110, three of the processing chambers 120, two of the load lock chambers 130a and 130b, and the radiation source 140. The polyhedral transfer chamber 110 includes a central transfer mechanism 112 which performs the physical transfer of a wafer 500. The polyhedral transfer chamber 110 is connected to the processing chambers 120 and the load lock chambers 130a and 130b. This configuration allows the central transfer mechanism 112 to transport at least one wafer 500 between the processing chambers 120 and the load lock chambers 130a and 130b. In some embodiments, a plurality of the wafers 500 can be transported in the cluster tool 100.

The sealed design of the cluster tool 100 protects the wafer 500 from outside contaminants, but many of the manufacturing procedures carried out within the cluster tool 100 may result in residues that are capable of damaging the wafer 500. For the purposes of the embodiments of this disclosure, residue may refer to a liquid film, a solid contaminant with or without the potential to outgas, particulate matter, any combination thereof, and/or any other undesirable compound in solid, liquid, or gaseous form. Examples of manufacturing procedures that may leave a residue on the wafer 500 include wet etching, dry etching, ashing, stripping, metal plating, chemical mechanical polishing (CMP), deposition, and/or any other suitable procedure. To illustrate, dry etching process gases can include an oxygen-containing gas, fluorine-containing gas (e.g., $NF_3$, $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases or plasmas, and/or combinations thereof. Sulfur, fluorine, chlorine, bromine and other reactive atoms may bond to photoresist during dry etching and later outgas to form destructive compounds including $SO_2$ and HF. Wet etching procedures apply etchants (e.g., $HNO_3$, HF, KOH, and/or TMAH) to the wafer 500. These etchants may remain on the wafer 500 after the etching is completed. Stripping processes can leave residues of cleaning solutions including H2SO4 (sulfuric acid) and H2O2 (hydrogen peroxide).

Residue damage is not limited to direct harm to the wafer 500 through such processes as hazing, erosion, and corrosion. Residue may trap particulate matter, distort lithographic imaging, and prevent other process chemicals from performing a desired effect. Residues can form directly on the wafer 500 through manufacturing procedures, can condense on the wafer 500 from the ambient environment, and can be deposited by other mechanisms. Therefore, the embodiments in this disclosure are associated with the reduction of the residues to improve yield of the wafer 500.

Reference is made to FIG. 1. The processing chamber 120 may be configured to perform a manufacturing procedure on the wafer 500. Wafer manufacturing procedures include deposition processes such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (CMP) processes; testing; other procedure involved in the processing of the wafer 500; and/or any combination of procedures. In some embodiments, the processing chambers 120 in FIG. 1 may be configured to perform the same or different manufacturing procedure(s) on the wafer 500 according to real situations.

The area of the cluster tool 100 defined by the polyhedral transfer chamber 110 and the processing chambers 120 is sealed. Atmospheric controls, including filtering, provide an environment with extremely low levels of particulates and airborne molecular contamination (AMC), both of which may damage the wafer 500. By creating a microenvironment within the cluster tool 100, the processing chambers 120 can be operated in a cleaner environment than the surrounding facilities. This allows tighter control of contaminates during wafer processing at reduced cost.

The cluster tool 100 further includes an equipment front end module (EFEM) 150. The load lock chambers 130a and 130b preserve the atmosphere within the polyhedral transfer chamber 110 and processing chambers 120 by separating them from the EFEM 150. That is, the polyhedral transfer chamber 110 is connected to the EFEM 150 through the load lock chambers 130a and 130b. The load lock chamber 130a includes two doors, a polyhedral transfer chamber door 131a and a load lock door 132a, and the load lock chamber 130b includes two doors, a polyhedral transfer chamber door 131b and a load lock door 132b. The wafer 500 is inserted into the load lock chamber 130a and both doors are sealed. The load lock chamber 130a is capable of creating an atmosphere compatible with the EFEM 150 or the polyhedral transfer chamber 110 depending on where the loaded wafer 500 is scheduled to be next. This may alters the gas content of the load lock chamber 130a by such mechanisms as adding purified gases or creating a vacuum, along with other suitable means for adjusting the load lock chamber atmosphere. When the correct atmosphere has been reached, the corresponding door may be opened, and the wafer 500 can be accessed.

The EFEM 150 provides a closed environment in which to transfer the wafer 500 into and out of the cluster tool 100. The EFEM 150 includes a load lock mechanism 152 which performs the physical transfer of the wafer 500. The wafer 500 is loaded through a load port 154. In FIG. 1, the wafer 500 arrives at the load port 154 contained in a transport carrier 160 such as a front-opening unified pod ("FOUP"), a front-opening shipping box ("FOSB"), a standard mechanical interface ("SMIF") pod, and/or other suitable container. The transport carrier 160 is a magazine for holding one or more wafers 500 and for transporting wafers 500 between manufacturing tools. In some embodiments, the transport carrier 160 may have features such as coupling locations and electronic tags to facilitate use with an automated materials handling system. The transport carrier 160 is sealed in order to provide a microenvironment for the wafer 500 contained within and to protect the wafer 500 and the cluster tool 100 against contamination. To prevent loss of the controlled atmosphere, the transport carrier 160 may have a door designed such that the transport carrier 160 remains sealed until it is docked with the load port 154.

The e-beam source 140 is configured to perform an e-beam treatment to the wafer 500 after the wafer 500 is performed the manufacturing procedure. In greater details, the e-beam source 140 is configured to remove the residues of the wafer 500 formed during the manufacturing procedure or suppress the formation of condense after the manufacturing procedure. Or, the e-beam source 140 is configured to tune a profile of a semiconductor structure of the wafer 500.

In FIG. 1, the e-beam source 140 can be an e-beam gun and is present in one of the processing chamber 120. For example, one of the processing chambers 120 is a dry etching chamber, and the e-beam source 140 is present in the dry etching chamber. However, in some other embodiments, the processing chamber 120 can be some other suitable chamber, such as a chamber for deposition or an oxidation chamber. That is, the e-beam source 140 can be present in the chambers mentioned above.

Figure 2A:
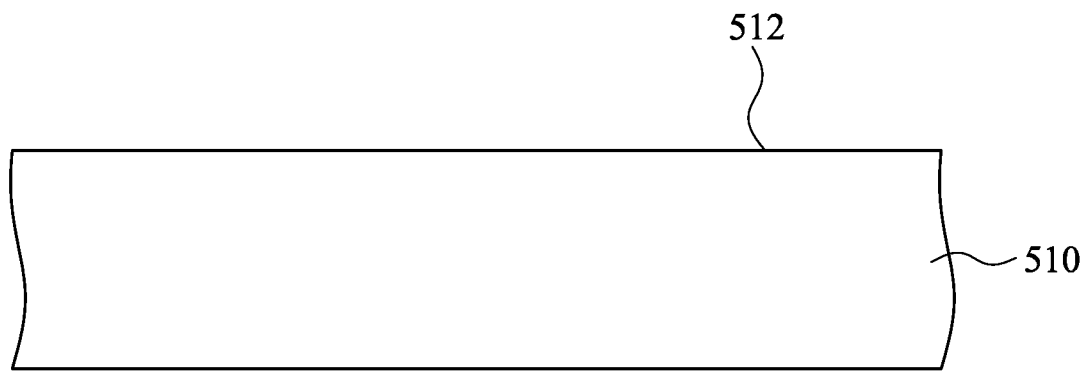
FIGS. 2A to 2D are cross-sectional views of a method for manufacturing a semiconductor structure at various stages in accordance with some embodiments of the present disclosure.

FIGS. 2A to 2D are cross-sectional views of a method for manufacturing a semiconductor structure at various stages in accordance with some embodiments of the present disclosure. In some embodiments, the cluster tool 100 of FIG. 1 is configured to process the wafer 500, which is also referred to as the semiconductor structure of FIGS. 2A to 2D. Reference is made to FIG. 2A. A substrate 510 is provided. The substrate 510 has a top surface 512. The substrate 510 can be a semiconductor layer. In some embodiments, the substrate 510 may include silicon (Si). Alternatively, the substrate 510 may include germanium (Ge), silicon germanium, gallium arsenide (GaAs) or other appropriate semiconductor materials. Also alternatively, the substrate 510 may include an epitaxial layer. For example, the substrate 510 may have an epitaxial layer overlying a bulk semiconductor. Further, the substrate 510 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 510 may include a semiconductor-on-insulator (SOI) structure such as a buried dielectric layer. Also alternatively, the substrate 510 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

Reference is made to FIGS. 1 and 2A. The wafer 500 of FIG. 2A is inserted to the load port 154. The load lock mechanism 152 of the EFEM 150 transfers the wafer 500 to the load lock chamber 130a, and the central transfer mechanism 112 further transfers the wafer 500 to one of the processing chamber 120 to process the following manufacturing procedures.

Figure 2B:
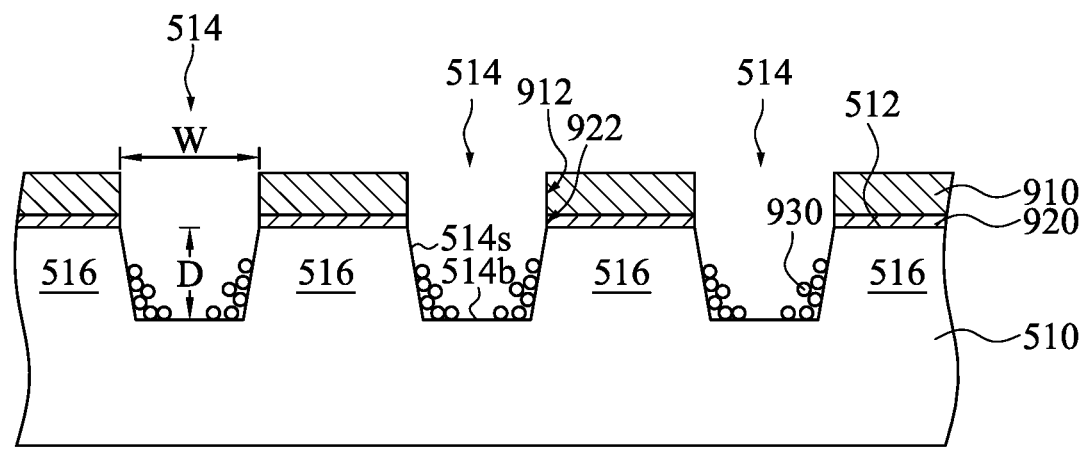

Reference is made to FIG. 2B. A patterned mask layer 910 (may be a hard mask layer) is formed over the top surface 512 of the substrate 510. The mask layer 910 maintains the integrity of the patterns during etching of a trench 514 formed in the substrate 510. In some embodiments, the mask layer 910 is used as a planarization stop layer during the removal of excess dielectric layer that fills the trench 514. In some embodiments, the mask layer 510 includes nitride. For example, the mask layer 910 is made of silicon nitride (SiN). However, other materials, such as SiON, silicon carbide, or a combination thereof, may also be used. The thickness of mask layer 910 can be in a range from about 200 nm to about 1200 nm. The mask layer 910 may be formed by a process such as chemical vapor deposition (CVD), plasma enhanced chemical vapor deposition (PECVD), or low pressure chemical vapor deposition (LPCVD). Alternatively, the mask layer 910 may be first made of a silicon oxide and then converted to SiN by nitridation.

Reference is made to FIG. 2B. A patterned mask layer 910 (may be a hard mask layer) is formed over the top surface 512 of the substrate 510. The mask layer 910 maintains the integrity of the patterns during etching of a trench 514 formed in the substrate 510. In some embodiments, the mask layer 910 is used as a planarization stop layer during the removal of excess dielectric layer that fills the trench 514. In some embodiments, the mask layer 910 includes nitride. For example, the mask layer 910 is made of silicon nitride (SiN). However, other materials, such as SiON, silicon carbide, or a combination thereof, may also be used. The thickness of mask layer 910 can be in a range from about 200 nm to about 1200 nm. The mask layer 910 may be formed by a process such as chemical vapor deposition (CVD), plasma enhanced chemical vapor deposition (PECVD), or low pressure chemical vapor deposition (LPCVD). Alternatively, the mask layer 910 may be first made of a silicon oxide and then converted to SiN by nitridation.

In some embodiments, a protective layer 920 is formed over the top surface 512 of the substrate 510 and between the mask layer 910 and the substrate 510. The protective layer 920 protects the top surface 512 from direct contact with the mask layer 910. For example, for a portion of the substrate 510 next to the trench 514 which is filled by insulation structure, the protective layer 920 can protect active regions 516 formed in the portion of the substrate 510. The active regions 516 are used for forming devices (such as transistors, resistors, etc.) after the insulation structure are formed. Depending upon the devices to be formed, the active regions 516 may include either an n-well or a p-well as determined by the design conditions. In some embodiments, the protective layer 920 is made of a thermal oxide. The thickness of the protective layer 920 may be in a range from about 20 nm to about 100 nm. Once formed, the mask layer 910 and the protective layer 920 are patterned through suitable photolithographic and etching processes to form openings 912 and 922 over the top surface 512 for the trench 514 of FIG. 2B.

Reference is made to FIGS. 1 and 2B. The exposed portions of the substrate 510 through the openings 912 and 922 are removed (or patterned) by an etching process in order to form the trench 514 in the substrate 510. The etching process may be a dry etching process, a wet etching process, or combinations thereof. The trench 514 faces the top surface 512 of the substrate 510 and separates the active regions 516 near the top surface 512 of the substrate 510.

The trench 514 has at least one sidewall 514s and a bottom surface 514b. The sidewall 514s is adjacent to the top surface 512 of the substrate 510 and connects the top surface 512 of the substrate 510 and the bottom surface 514b of the trench 514. In some embodiments, the trench 514 has a width W and a depth D (sometimes referred to herein as trench height). An aspect ratio of the trench 514 is defined to be the depth D divided by the width W.

After the etching process, residues 930 may be formed on the sidewall 514s of the trench 514, where the residues 930 may be fluorine-containing gas or passivation gas. The etching gas (of dry etching) or etchants (of wet etching) may interact with the residues 930 and widen the width W of the trench 514, such that the aspect ratio of the trench 514 is reduced. Therefore, an e-beam treatment can be performed to the wafer 500 of FIG. 2B to remove the residues 930.

Figure 2C:
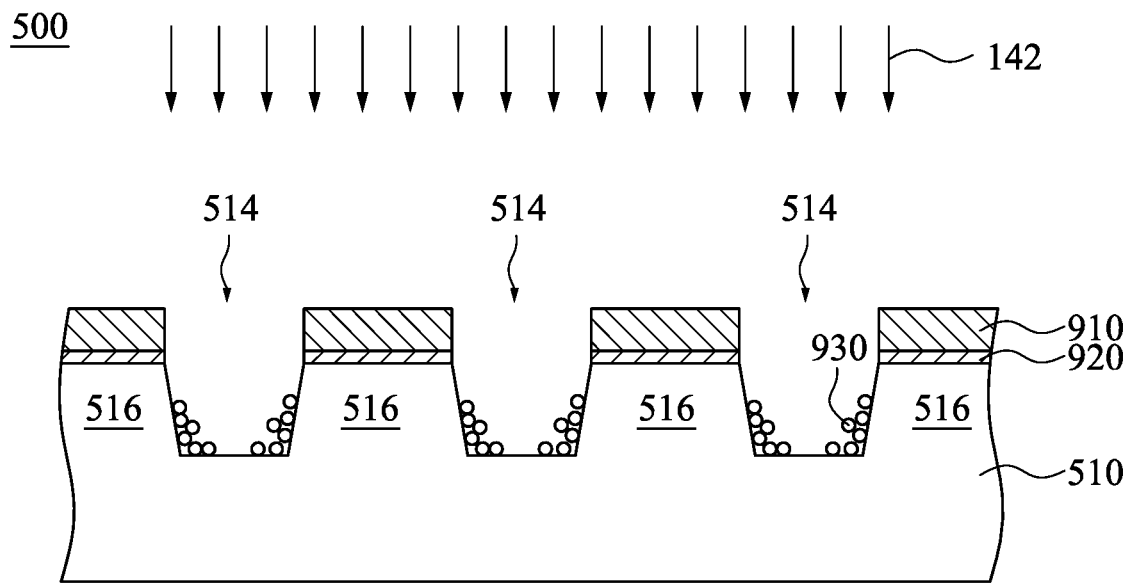

Reference is made to FIGS. 1 and 2C. In FIG. 1, the e-beam source 140 is present in the processing chamber 120. The e-beam source 140 provides an e-beam 142 to the wafer 500 to remove the residues 930. That is, the e-beam treatment is an in-situ e-beam treatment, which means the e-beam treatment and the etching process are performed in the same chamber (i.e., the processing chamber 120). In some embodiments, the e-beam 142 can be tuned to remove specific type of the residues 930. For example, the wavelength, the energy, and/or other suitable properties of the e-beam 142 can be tuned according to the material of the residues 930. In some embodiments, the wavelength of the e-beam 142 can be in a range from about 0.01 nm to about 10 nm, the energy of the e-beam 142 can be in a range from about 0 eV to about 30 keV, and the e-beam 142 can be a laser, and the embodiments of this disclosure is not limited in this respect. For example, the energy of the e-beam 142 can be about 1 keV to remove the residues 930 formed during the etching process. The wavelength of the e-beam 142 can be determined according to Moseley's law.

Figure 2D:
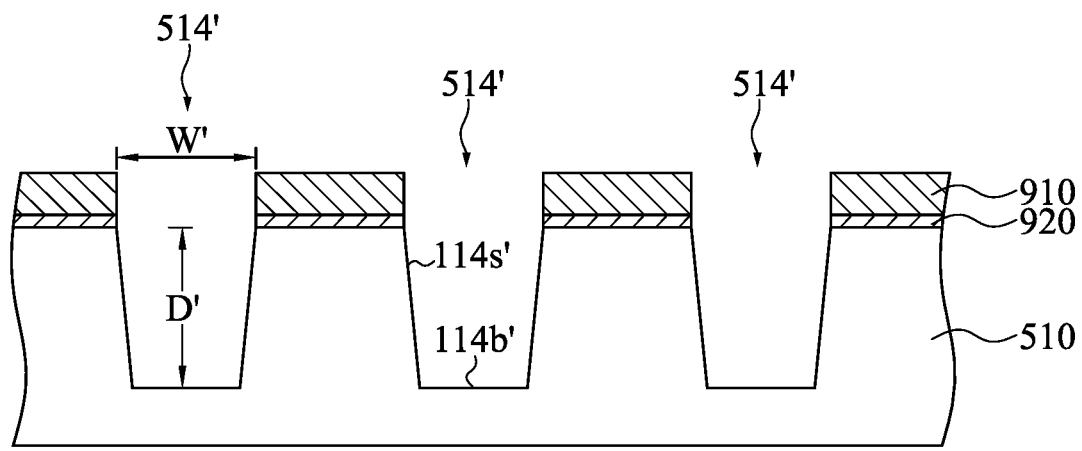

Reference is made to FIG. 2D. The wafer 500 of FIG. 2C is further patterned or etched to form the trench 514'. Since the residues 930 of FIG. 2C is removed, the trench 514' can be etched deeper without increasing its width W. Therefore, the aspect ratio of the trench 514' can be increased, and the sidewall 514s' of the trench 514' can be substantially vertical than the sidewall 514s of the trench 514 in FIG. 2B. In some embodiments, the trench 514' has a width W' in a range from about 20 nm to about 100 nm. In some embodiments, the trench 514' has a depth D' in a range from about 50 nm to about 350 nm. An aspect ratio, the depth D' (sometimes referred to herein as trench height) divided by the width W', of the trench 514' can be greater than about 7, which can be referred to as high aspect ratio. In some other embodiments, the aspect ratio may even be greater than about 8, although it may also be lower than about 7, or between 7 and 8. One skilled in the art will realize, however, that the dimensions and values recited throughout the descriptions are merely examples, and may be changed to suit different scales of semiconductor structures.

In FIGS. 2A-2D, the etching process of FIG. 2B produces the residues 930. The e-beam treatment can be performed to remove the residues 930 to lower the damage of the wafer 500 and improve yield of the wafer 500. Furthermore, since the etching gas or etchants may react with the residues 930, which affects the etching profile of the semiconductor structure, the removing of the residues 930 also has an ability to determine the patterning condition, i.e., to tune the etching profile, such as the aspect ratio, the thickness, the angle of the sidewall, and/or the critical dimension, of the semiconductor structure, improving the profile of the semiconductor structure. Moreover, since the residues 930 are removed during the e-beam treatment of FIG. 2C, the wafer 500 can suppress the formation of condense if the wafer 500 has a long waiting time before the next manufacturing procedure.

Reference is made to FIG. 1. After the process of FIG. 2D, the wafer 500 is transferred to the load lock chambers 130b. In some embodiments, the cluster tool 100 further includes a cooling chamber 170 configured to lower the temperature of the wafer 500. The wafer 500 can be cooled down in the cooling chamber 170 and then be transferred to the load port 154.

Figure 3:
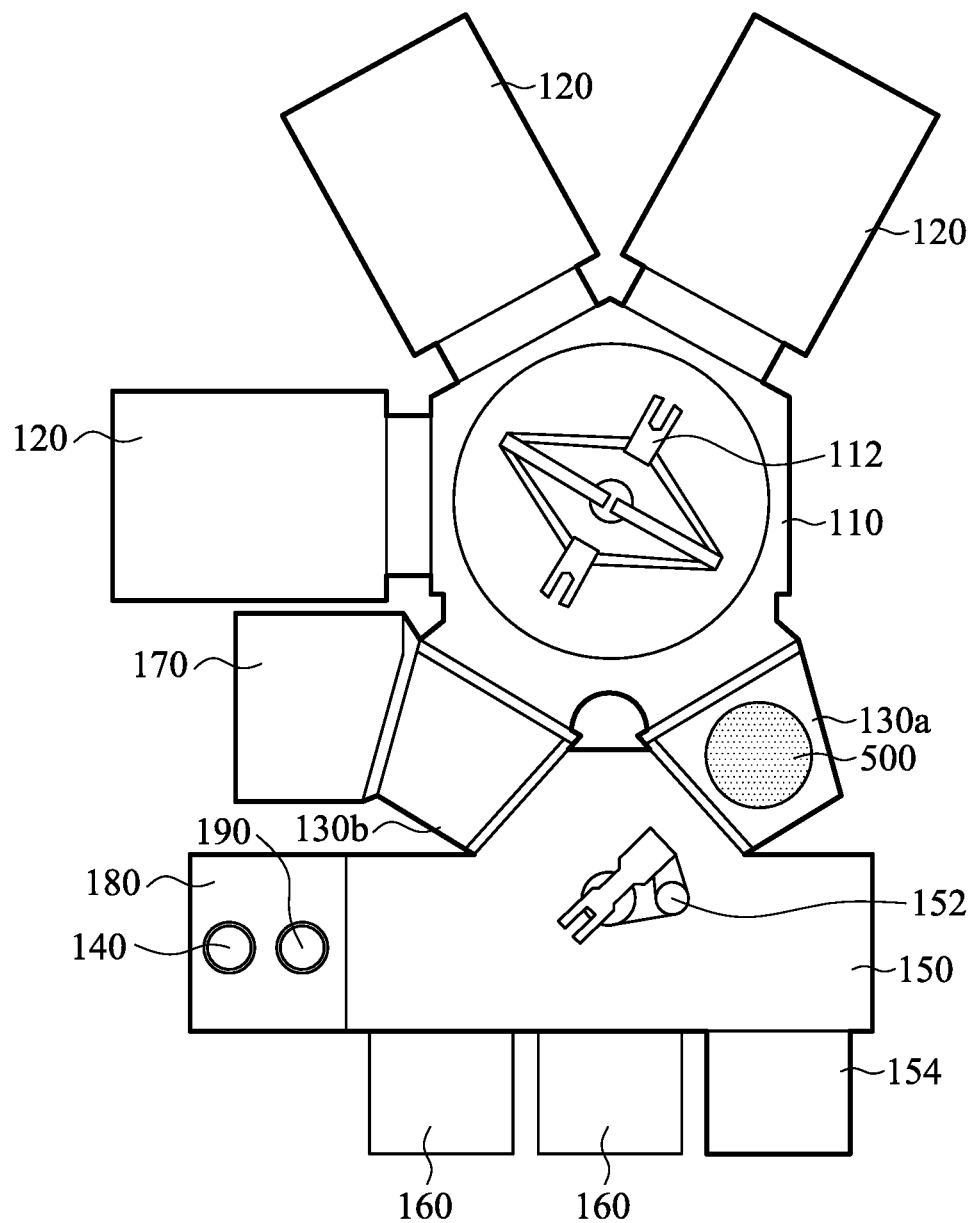
FIG. 3 is a schematic plan view of a cluster tool in accordance with some embodiments of the present disclosure.
Figure 4:
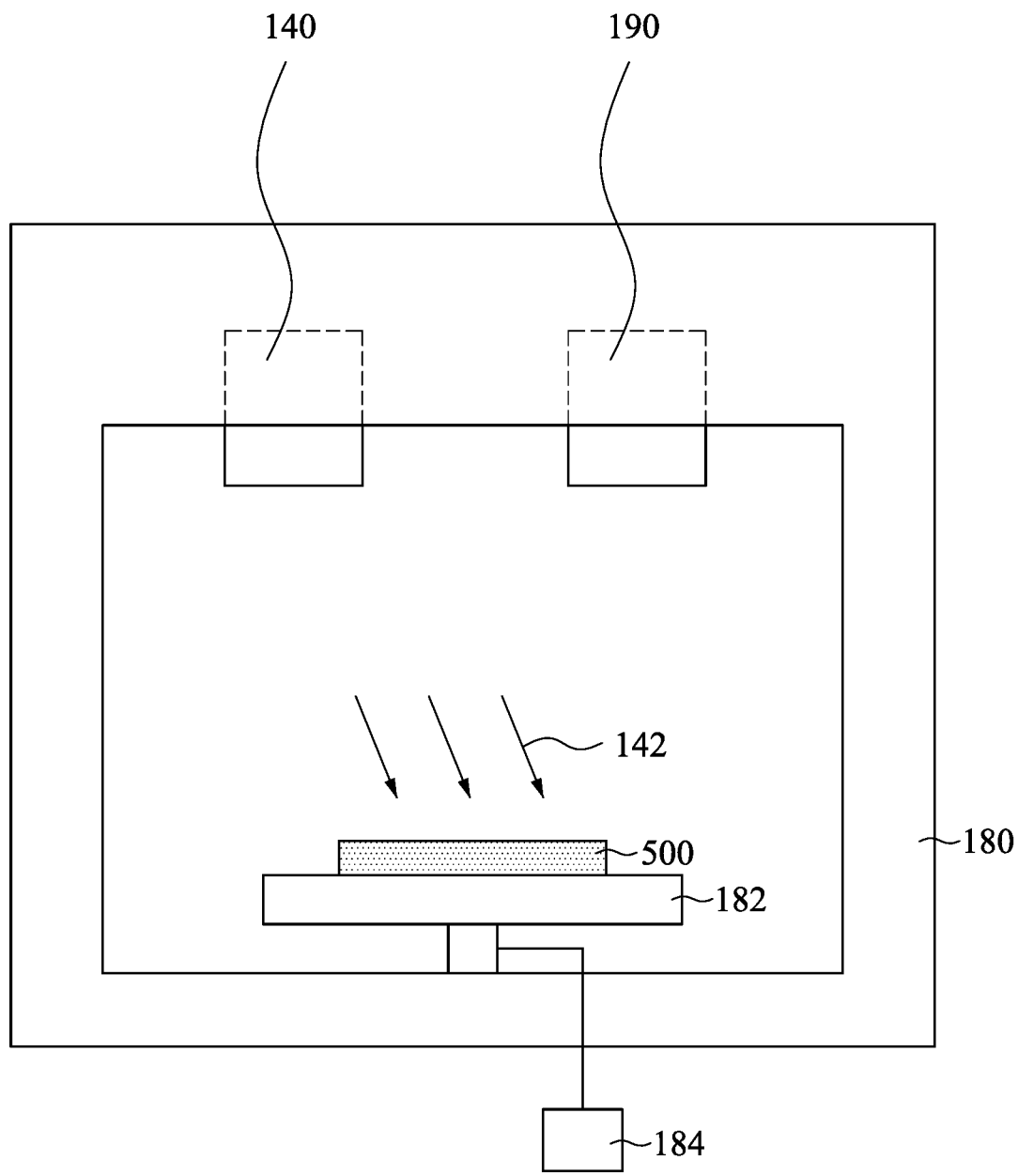
FIG. 4 is a cross-sectional view of an e-beam chamber of FIG. 3.

FIG. 3 is a schematic plan view of a cluster tool 100 in accordance with some embodiments of the present disclosure, and FIG. 4 is a cross-sectional view of an e-beam chamber 180 of FIG. 3. In FIG. 3, the cluster tool 100 further includes an e-beam chamber 180 present in the EFEM 150. The e-beam source 140 is present in the e-beam chamber 180. That is, the e-beam source 140 is separated from the processing chamber 120. As such, the wafer 500 undergoes the manufacturing procedure and the e-beam treatment in different chambers. The wafer 500 can be disposed in the e-beam chamber 180 to process the e-beam treatment. For example, the wafer 500 can be disposed on a supporting plate 182 of the e-beam chamber 180, and the e-beam source 140 is present above the supporting plate 182. The e-beam source 140 can normally or obliquely provide the e-beam 142 to the wafer 500. In some embodiments, the e-beam chamber 180 further includes a translation mechanism 184, such as an XYZ stage, configured to shift the supporting plate 182.

In some embodiments, the cluster tool 100 further includes a measurement apparatus 190 present in the e-beam chamber 180. In some embodiments, the measurement apparatus 190 can be an optical microscope, which is configured to measure the profile of the wafer 500 or perform a defect scanning process on the wafer 500. That is, the e-beam chamber 180 can be a multi-functional chamber.

Figure 5A:
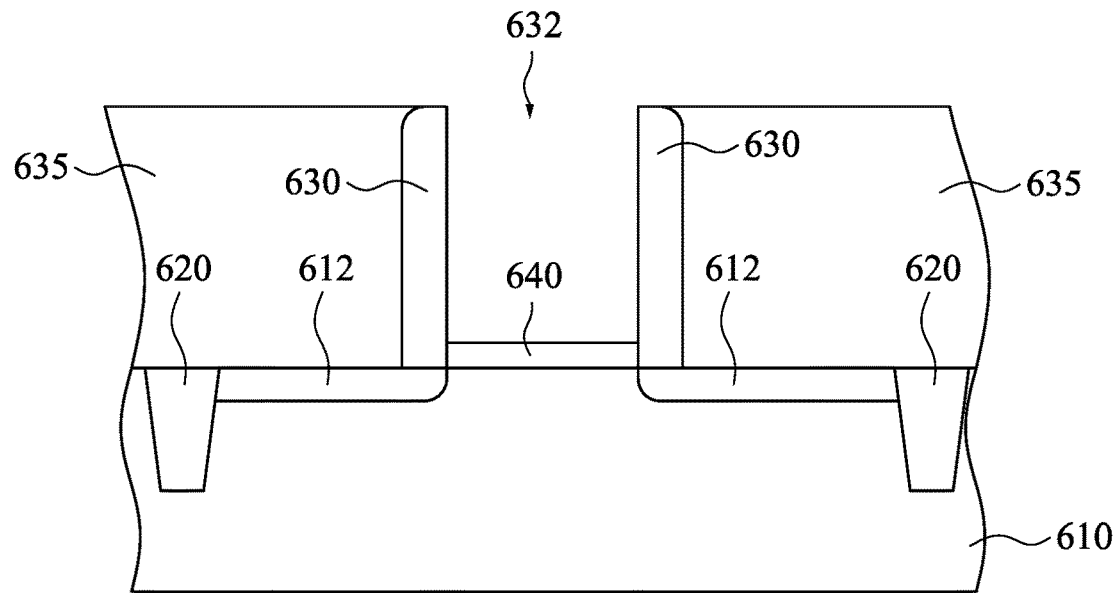
FIGS. 5A to 5E are cross-sectional views of a method for manufacturing a semiconductor structure at various stages in accordance with some embodiments of the present disclosure.

FIGS. 5A to 5E are cross-sectional views of a method for manufacturing a semiconductor structure at various stages in accordance with some embodiments of the present disclosure. In some embodiments, the cluster tool 100 of FIG. 1 or 3 is configured to process the wafer 500, which is also referred to as the semiconductor structure of FIGS. 5A to 5E. Reference is made to FIG. 5A. The semiconductor structure is provided. The semiconductor structure includes a substrate 610 and a plurality of gate spacer 630. The substrate 610 and the substrate 510 of FIG. 2A may have the same or similar material, and, therefore, a description in this regard will not be repeated hereinafter.

The substrate 610 may include various doped regions 612 such as n-well and p-wells. The substrate 610 also includes various isolation features, such as shallow trench isolation (STI) 620, formed in the substrate 610 to separate various devices. The gate spacers 630 are formed on the substrate 610 and form an opening 632 therebetween. The gate spacer 630 may include a seal spacer and a main spacer (not shown). The gate spacers 630 include one or more dielectric materials, such as silicon oxide, silicon nitride, silicon oxynitride, or combinations thereof. The gate spacers 630 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 630 may include blanket forming spacer layers, and then performing etching steps to remove the horizontal portions of the spacer layers. The remaining vertical portions of the gate spacer layers form the gate spacers 630.

The semiconductor structure further includes a dielectric layer 635, also referred to as an interlayer dielectric, present on the substrate 610 and surrounding the gate spacers 630. The dielectric layer 635 may be formed by chemical vapor deposition (CVD), high-density plasma CVD, spin-on, sputtering, or other suitable methods. In some embodiments, the dielectric layer 635 includes silicon oxide. In some other embodiments, the dielectric layer 635 may include silicon oxy-nitride, silicon nitride, or a low-k material.

In FIG. 5A, a replacement gate (RPG) process scheme is employed. In a RPG process scheme, a dummy polysilicon gate is formed first and is replaced later by a metal gate after high thermal budget processes are performed. In some embodiments, the dummy gate electrode (not shown) is removed to form the opening 632 with the gate spacers 630 as its sidewall. In some other embodiments, the gate dielectric 640 present between the dummy gate and the substrate 610 is removed as well. Alternatively, in some embodiments, the dummy gate electrode is removed while the gate dielectric 640 retains as shown in FIG. 5A.

Figure 5B:
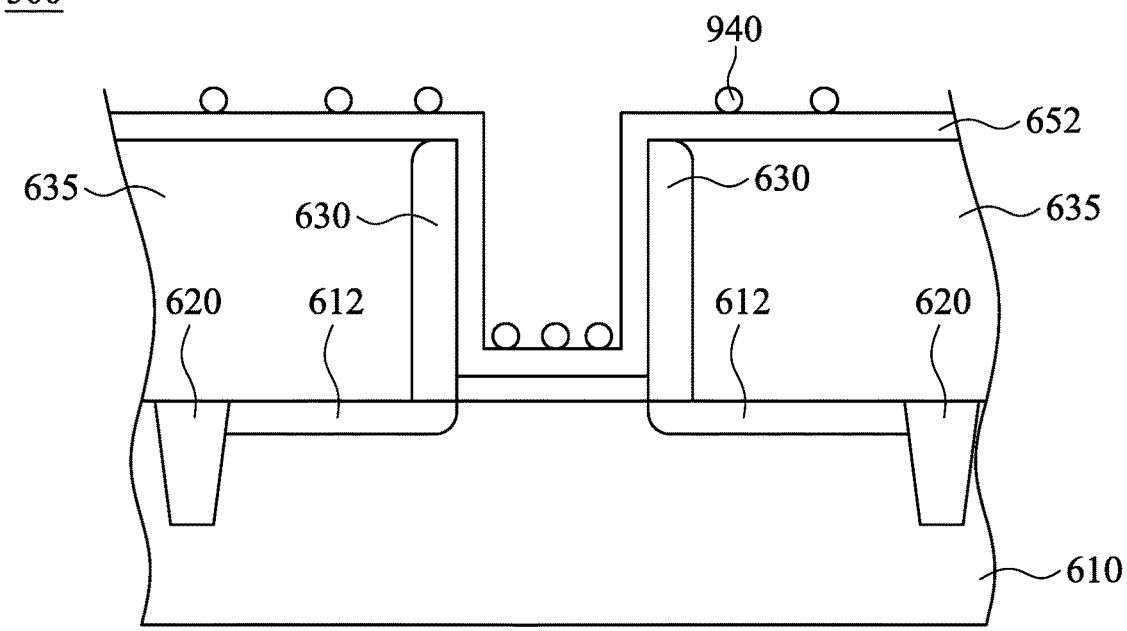

Reference is made to FIGS. 3 and 5B. The wafer of FIG. 5A is transferred to one of the processing chambers 120 to perform a deposition process. That is, the processing chamber 120 can be a chemical vapor deposition (CVD) chamber, a physical vapor deposition (PVD) chamber, a plasma-enhanced chemical vapor deposition (PECVD) chamber, or other suitable deposition chamber.

At least one metal gate layer 652 is formed in the opening 632 of FIG. 5A. The metal gate layer 652 may be gate dielectric layer(s), capping layer(s), fill layer(s), and/or other suitable layers that are desirable in a metal gate stack. A work function metal layer may be an n-type or p-type work function layer. Exemplary p-type work function metals include TiN, TaN, Ru, Mo, Al, WN, ZrSi2, MoSi2, TaSi2, NiSi2, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the capping layer may include refractory metals and their nitrides (e.g. TiN, TaN, W2N, TiSiN, TaSiN). In some embodiments, the fill layer may include tungsten (W).

Figure 5C:
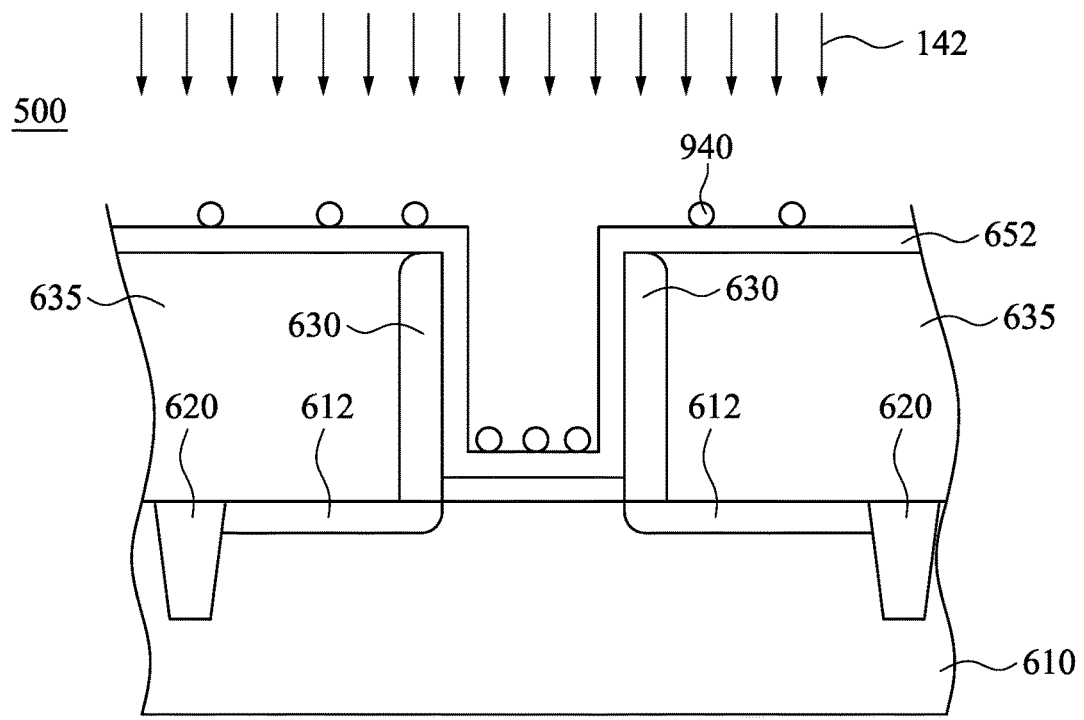

Reference is made to FIGS. 3 and 5C. After the metal gate layer 652 is formed, some residues 940 may formed on the metal gate layer 652. The residues 940 may be the extra particles of the target of deposition or plasma. Therefore, an e-beam treatment is performed on the wafer 500 of FIG. 5B to remove the residues 940. In some embodiments, the wafer 500 of FIG. 5B is transferred to the e-beam chamber 180 to perform the e-beam treatment. The e-beam source 140 provides the e-beam 142 to the wafer 500 to remove the residues 940. In some embodiments, the energy of the e-beam 142 to remove the residues 940 may be about 5 keV, and the embodiments of this disclosure are not limited in this respect. In some other embodiments, if the e-beam source 140 is present in the processing chamber 120 as shown in FIG. 1, the e-beam treatment can be performed in the processing chamber 120.

Figure 5D:
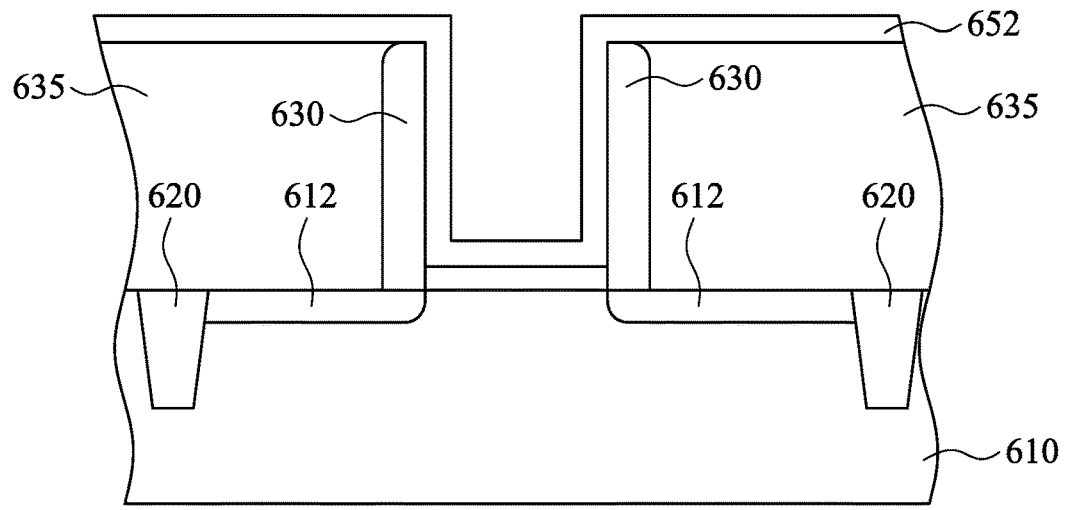

Reference is made to FIGS. 3 and 5D. After the performance of e-beam treatment, the wafer 500 of FIG. 5C is transferred back to the processing chamber 120 to perform the next deposition process. Since the residues 940 are removed during the e-beam treatment of FIG. 5C, the wafer 500 can suppress the formation of condense if the wafer 500 has a long waiting time before the next manufacturing procedure.

Figure 5E:
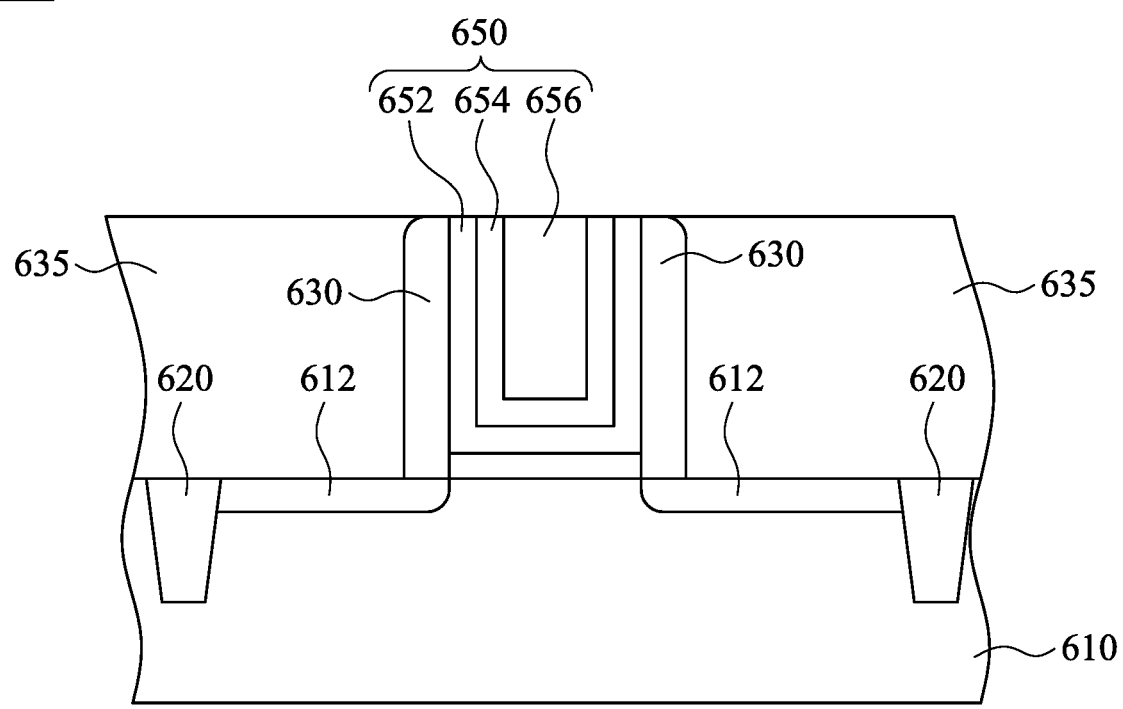

Reference is made to FIG. 5E. Another metal gate layer 654 is formed on the metal gate layer 652. The metal gate layer 654 may be gate dielectric layer(s), capping layer(s), fill layer(s), and/or other suitable layers that are desirable in a metal gate stack. The process of FIGS. 5B and 5C, i.e., the deposition and the e-beam treatment, can be repeated until the metal gate stack 650 is formed. In some embodiments, the metal gate stack 650 includes the metal gate layers 652, 654, and 656. The metal gate layer 652 can be a work function layer, the metal gate layer 654 can be a cap layer, and the metal gate layer 656 can be a filling layer, and the embodiments of this disclosure is not limited in this respect. In some embodiments, a plurality of the deposition processes can be performed and the e-beam treatment is then performed.

In FIGS. 5A-5E, the deposition process of FIG. 5B produces the residues 940. The e-beam treatment can be performed to remove the residues 940 to lower the damage of the wafer 500 and improve yield of the wafer 500. Furthermore, since the residues 940 are removed during the e-beam treatment of FIG. 5C, the wafer 500 can suppress the formation of condense if the wafer 500 has a long waiting time before the next manufacturing procedure.

According to some embodiments, a cluster tool includes a polyhedral transfer chamber, at least one processing chamber, at least one load lock chamber, and an electron beam (e-beam) source. The processing chamber is connected to the polyhedral transfer chamber. The processing chamber is configured to perform a manufacturing procedure to a wafer present therein. The load lock chamber is connected to the polyhedral transfer chamber. The e-beam source is configured to performing an e-beam treatment to the wafer after the wafer is performed the manufacturing procedure.

According to some embodiments, a method for manufacturing a semiconductor structure includes performing a manufacturing procedure on a substrate. The manufacturing procedure forms at least one residue on the substrate. An e-beam treatment is performed to remove the residue.

According to some embodiments, a method for manufacturing a semiconductor structure includes performing a first patterning process to form at least one trench in a semiconductor layer. An e-beam treatment is performed to tune a patterning condition of the trench. A second pattering process is performed to the e-beam treated trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure comprising:
depositing a first metal gate layer of a gate stack on a substrate, wherein at least one residue is formed on the first metal gate layer;
tuning a wavelength of an e-beam of an e-beam treatment from a first specific wavelength to a second specific wavelength that is different from the first specific wavelength and that is configured to remove a specific type of residue; and
performing the e-beam treatment at the second specific wavelength on the first metal gate layer to remove the residue while the first metal gate layer is exposed.

2. A method for manufacturing a semiconductor structure comprising:
performing a first etching process to form at least one trench in a semiconductive layer, wherein the trench extends from a top of the semiconductive layer to a first depth in the semiconductive layer and not through the semiconductive layer after performing the first etching process;
tuning an energy of an e-beam of an e-beam treatment from a first specific energy level to a second specific energy level that is different from the first specific energy level and that is configured to remove a specific type of residue of the first etching process;
performing the e-beam treatment at the specific energy level on a first sidewall of the trench to remove the residue of the first etching process; and
performing a second etching process to deepen the trench in the semiconductive layer after performing the e-beam treatment, wherein the trench extends from the top of the semiconductor layer to a second depth in the semiconductor layer and not through the semiconductive layer after performing the second etching process.

3. The method of claim 2, wherein the e-beam treatment and the first etching process are performed in the same chamber.

4. The method of claim 2, further comprising determining energy of the e-beam according to a profile of the trench formed in the first etching process.

5. A method for manufacturing a semiconductive structure comprising:
transferring a substrate to a processing chamber to perform a deposition procedure to form a first metal gate layer of a gate stack over the substrate, wherein the first metal gate layer is formed in an opening in a dielectric layer over the substrate and on a top surface of the dielectric layer;
tuning a property an e-beam of an e-beam treatment from a first specific property to a second specific property that is different from the first specific property and that is configured to remove a specific type of residue of the deposition procedure;
performing the e-beam treatment at the specific property on the first metal gate of the gate stack while the first metal gate layer is exposed on the top surface of the dielectric layer; and
after performing the e-beam treatment, performing a second deposition procedure to form a second metal gate layer of the gate stack over the first metal gate layer of the gate stack.

6. The method of claim 5, wherein the performing the e-beam treatment comprises transferring the substrate from the processing chamber to an e-beam chamber.

7. The method of claim 6, further comprising performing a measurement procedure in the e-beam chamber.

8. The method of claim 5, wherein the e-beam treatment is an in-situ e-beam treatment.

9. The method of claim 2, wherein performing the second etching process is such that a second sidewall of the trench is more vertical than the first sidewall.

10. The method of claim 2, wherein performing the first etching process is such that the trench is between active regions of the semiconductive layer.

11. The method of claim 1, further comprising, after performing the e-beam treatment, forming a second metal gate layer of the gate stack over the first metal gate layer of the gate stack.

12. The method of claim 1, further comprising transferring the substrate to an equipment front end module (EFEM), wherein the e-beam treatment is performed in the EFEM.

13. The method of claim 12, wherein transferring the substrate to the EFEM includes:
placing the wafer on a supporting plate in an e-beam chamber in the EFEM; and
shifting the supporting plate by a translation mechanism.

14. The method of claim 2, wherein the first etching process is performed using a mask layer on a top surface of the semiconductive layer as an etch mask and the e-beam treatment is performed while the mask layer is on the top surface of the semiconductive layer.

15. The method of claim 5, further comprising, after performing the e-beam treatment, removing the first metal gate layer from the top surface of the dielectric layer.

16. The method of claim 1, wherein the first specific wavelength is configured to remove a fluorine-based type of residue and the second specific wavelength is configured to remove a metal-based type of residue.

17. The method of claim 2, wherein the second specific energy level is configured to remove a non-fluorine-based type of residue.

18. The method of claim 5, wherein the first specific property is configured to remove a non-fluorine-based type of residue and the second specific property is configured to remove a metal-based type of residue.

19. The method of claim 11, further comprising performing another e-beam treatment with a third specific wavelength that is different from the second specific wavelength on the second metal gate layer.

20. The method of claim 5, further comprising performing another e-beam treatment with a third specific property that is different from the second specific property on the second metal gate layer.

* * * * *